(12) United States Patent
Goessel et al.

(10) Patent No.: US 8,136,009 B2
(45) Date of Patent: Mar. 13, 2012

(54) CIRCUIT ARRANGEMENT AND METHOD FOR ERROR DETECTION AND ARRANGEMENT FOR MONITORING OF A DIGITAL CIRCUIT

(75) Inventors: Michael Goessel, Mahlow (DE); Egor Sogomonyan, Potsdam (DE)

(73) Assignee: Infineon Technologies AG, Neubiberg (DE)

( * ) Notice: Subject to any disclaimer, the term of this patent is extended or adjusted under 35 U.S.C. 154(b) by 887 days.

(21) Appl. No.: 12/188,746

(22) Filed: Aug. 8, 2008

(65) Prior Publication Data

US 2009/0049369 A1 Feb. 19, 2009

Related U.S. Application Data

(63) Continuation of application No. PCT/DE2007/000234, filed on Feb. 8, 2007.

(30) Foreign Application Priority Data

Feb. 8, 2006 (DE) .......................... 10 2006 005 836

(51) Int. Cl.
G06F 11/00 (2006.01)
(52) U.S. Cl. ........................................ 714/757; 714/807
(58) Field of Classification Search .................. None
See application file for complete search history.

(56) References Cited

U.S. PATENT DOCUMENTS

| | | | | |
|---|---|---|---|---|
| 4,498,174 A | * | 2/1985 | LeGresley | 714/757 |
| 4,780,875 A | * | 10/1988 | Sakai | 714/757 |
| 4,918,638 A | | 4/1990 | Matsumoto et al. | |
| 5,134,618 A | * | 7/1992 | Matt et al. | 714/757 |
| 5,446,745 A | | 8/1995 | Gibbs | |
| 6,027,243 A | * | 2/2000 | Owada | 714/801 |
| 6,108,812 A | * | 8/2000 | Born | 714/807 |
| 6,295,626 B1 | * | 9/2001 | Nair et al. | 714/807 |
| 6,304,992 B1 | * | 10/2001 | Cypher | 714/757 |
| 6,389,575 B1 | * | 5/2002 | Hill | 714/807 |
| 6,530,057 B1 | * | 3/2003 | Kimmitt | 714/758 |
| 6,560,746 B1 | * | 5/2003 | Morsberger | 714/781 |
| 2009/0019344 A1 | * | 1/2009 | Yoon et al. | 714/807 |

* cited by examiner

OTHER PUBLICATIONS

Srinivasan, G.R., et al., "Accurate, Predictive Modeling of Soft Error Rate Due to Cosmic Rays and Chip Alpha Radiation," 1994 IEEE International Reliability Physics Symposium, Apr. 11-14, 1994, pp. 12-16. Dutta, A., et al., "Synthesis of Non-Intrusive Concurrent Error Detection Using an Even Error Detecting Function," 2005 IEEE International Test Conference, Nov. 8, 2005, pp. 1-8.

*Primary Examiner* — Christopher McCarthy
(74) *Attorney, Agent, or Firm* — Slater & Matsil, L.L.P.

(57) ABSTRACT

A circuit arrangement is formed as follows. A combinational circuit has n binary inputs E1, . . . , En for inputting n ($n \geq 2$) information bits $x1, \ldots, xn$ and m binary outputs for outputting m ($m \geq 1$) check bits $c1, \ldots, cm$. The combinational circuit is configured for realizing a Boolean function $ci=fi(xi1, \ldots, xini)$ for $i=1, \ldots, m$ at the i-th output for determining a check bit $ci$, wherein the set $\{xi1, \ldots, xini\}$ at the ni information bits that determine the check bit ci is a subset of all n information bits $\{x1, \ldots, xn\}$. The combinational circuit is furthermore configured for realizing a first Boolean function $f1(x11, \ldots, x1n1)$ of the form $c1=f1(x11, \ldots, x1n1)= f11(x11, x12)$ XOR $f12(x13, x14)$ XOR $\ldots$ XOR $f1k1(x1(n1-1), x1n1)$ at a first output for outputting a first check bit c1, wherein n1 is an even number where $n1 \geq 2$ and $2 k1=n1$ and the Boolean functions $f11(x11, x12), \ldots, f1k1(x1(n1-1), x1n1)$ are in each case nonlinear Boolean functions of two variables which can be realized by logic gates having two inputs and one output, wherein the logic gates each have a controlling value $c11, \ldots, c1k1$.

19 Claims, 8 Drawing Sheets

CIRCUIT ARRANGEMENT AND METHOD FOR ERROR DETECTION AND ARRANGEMENT FOR MONITORING OF A DIGITAL CIRCUIT

This application is a continuation of co-pending International Application No. PCT/DE2007/000234, filed Feb. 8, 2007, which designated the United States and was not published in English, and which claims priority to German Application No. 10 2006 005 836.4 filed Feb. 8, 2006, both of which applications are incorporated herein by reference.

TECHNICAL FIELD

The invention is in the field of error detection in digital circuits.

BACKGROUND

On account of the high degree of integration of electronic circuits, the susceptibility to errors and the frequency of errors in electronic circuits are increasing. In particular, the frequency of non-permanent or transient errors is increasing, these errors having an effect as so-called soft errors in registers. Such soft errors are caused by radiation, for example, and they often affect adjacent bits.

It is known to protect electronic circuits and generally data in data processing by means of codes. The codes used in this case are, for example, the parity bit code, the Hamming code, BCH codes, the Berger code (see, for example, Berger, J. M.: "*A Note on Error Detection Codes for Asymetric Channels*", Information and Control, Vol. 4, 1961, pp. 68-73) and the Bose-Lin code (see, for example, Lin et al.: "*Error Control Coding, Fundamentals and Applications*", Prentice Hall, 1983; Bose et al.: "*Systematic Unidirectional Error Detecting Codes*", IEEE Trans. Computers, C34, 1026-1032, 1985).

In a circuit for implementing the parity bit code, the n information or data bits, where n is greater than or equal to 2, are logically combined by XOR gates in a parity tree to form a single additional parity bit, that is to say a single check bit. An error in an individual bit, or in an odd number of data bits, leads to a change in the parity bit and thus to a detection of such an error. What is advantageous about the parity bit code is that only a single additional check bit for error detection has to be added independently to the number n of data bits to be checked. What is disadvantageous is that all errors that corrupt an even number of bits are not detected with this code.

If parity is implemented for a plurality of non-overlapping groups of information bits, then 2-bit errors cannot be detected if they corrupt bits of the same group, which is disadvantageous. All 1-bit errors and all 2-bit errors can be reliably detected using a Hamming code.

What is disadvantageous here, in particular, is that the outlay for realizing error detection by means of a Hamming code is relatively high. In particular, the number m of bits required for error detection increases as the number n of data bits to be monitored increases, which leads to a relatively high outlay, which is disadvantageous. In addition, the Hamming code, as already explained, does not detect all odd errors, which is likewise disadvantageous. Even errors such as 4-bit, 6-bit, . . . errors are detected only in part.

As a generalization of Hamming codes, consideration is given to fire codes and BCH codes, which have better error detection properties than Hamming codes but require an even higher outlay for their realization than Hamming codes.

Berger codes are furthermore known, which detect all unidirectional errors in which the erroneous bits each change in one direction, that is to say that all the erroneous bits change from 0 to 1 or all the erroneous bits change from 1 to 0. In these codes too, the number of additional m check bits required increases as the number of data bits to be monitored increases, which is disadvantageous in particular for large numbers n of data bits. An essential disadvantage is, in particular, that errors in which an identical number of bits change from 0 to 1 and from 1 to 0 cannot be detected. In particular, all bidirectional 2-bit errors, that is to say those 2-bit errors in which a first value 1 changes erroneously to 0 and a second value 0 changes erroneously to 1, cannot be detected, under any circumstances. That even applies to all adjacent 2-bit errors that can often occur, in particular, as soft errors.

An error detecting code having a fixed number m of check bits independently of the number n of data bits is the Bose-Lin code. In the same way as the Berger code, it does not detect all bidirectional 2-bit errors, even if they are adjacent, which is disadvantageous.

U.S. Pat. No. 5,446,745 discloses a device for error correction on an optical storage media. Reed-Solomon errors are dealt with. The various embodiments utilize XOR elements which realize linear Boolean functions. An essential aim in the case of the known device is to reduce the number of XOR elements.

U.S. Pat. No. 4,918,638 discloses a circuit for multiplying two polynomials in a Galois field. In one configuration, the circuit for polynomial multiplication in the Galois field comprises subcircuits (columns) (see FIG. 5 therein).

SUMMARY OF THE INVENTION

Embodiments of the invention are based on specifying an improved possibility for generating at least one check bit that can be evaluated for error detection for a circuit arrangement, wherein the at least one check bit can be derived from n ($n \geq 2$), information or data bits and wherein the number of check bits is as small as possible, which does not depend on the even number n of information or data bits. The intention is to detect all odd errors and as many even errors as possible of the information or data bits at least with the probability 1/2 from alterations of the check bits.

One aspect of the invention provides the use of a circuit arrangement for generating at least one check bit that can be evaluated for error detection. The circuit arrangement is formed as follows. A combinational circuit has n binary inputs $E_1, \ldots, E_n$ for inputting n ($n \geq 2$) information bits $x_1, \ldots, x_n$ and m binary outputs for outputting m ($m \geq 1$) check bits $c_1, \ldots, c_m$. The combinational circuit is configured for realizing a Boolean function $c_i = f_i(x_{i1}, \ldots, x_{ini})$ for $i=1, \ldots, m$ at the i-th output for determining a check bit $c_i$, wherein the set $\{x_{i1}, \ldots, x_{ini}\}$ at the $n_i$ information bits that determine the check bit $c_i$ is a subset of all n information bits $\{x_1, \ldots, x_n\}$. The combinational circuit is furthermore configured for realizing a first Boolean function $f_1(x_{11}, \ldots, x_{1n1})$ of the form $c_1 = f_1(x_{11}, \ldots, x_{1n1}) = f_{11}(x_{11}, x_{12})$ XOR $f_{12}(x_{13}, x_{14})$ XOR $\ldots$ XOR $f_{1k1}(x_{1(n1-1)}, x_{1n1})$ at a first output for outputting a first check bit $c_1$, wherein $n_1$ is an even number where $n_1 \geq 2$ and $2k_1 = n_1$ and the Boolean functions $f_{11}(x_{11}, x_{12}), \ldots, f_{1k1}(x_{1(n1-1)}, x_{1n1})$ are in each case nonlinear Boolean functions of two variables which can be realized by logic gates having two inputs and one output, wherein the logic gates each have a controlling value $c_{11}, \ldots, c_{1k1}$.

Another aspect of the invention provides the use of an arrangement for monitoring a digital circuit. The arrangement is formed as follows. A circuit arrangement generates at least one check bit that can be evaluated for error detection. At least one further circuit is also provided. The digital circuit has r inputs and n functional outputs A1, ..., An. m check bits c1, ... cm that can be evaluated for error detection can be generated from n information bits x1, ..., xn by means of the circuit arrangement. The digital circuit is connected upstream of the circuit arrangement. The r inputs of the digital circuit carry binary input signals z=z1, ..., zr and the n outputs of the digital circuit carry binary output signals x=x1, ..., xn, such that the outputs of the digital circuit are simultaneously connected to the n functional outputs A1, ..., An and the inputs E1, ..., En of the circuit arrangement. The r inputs of the digital circuit are furthermore connected to another circuit, wherein the other circuit is functionally identical to the digital circuit and the outputs of the other circuit, with inputting of the values z=z1, ..., zn, carry the binary values x1', ..., xn'. The outputs of the other circuit are connected to n inputs of a further circuit, wherein the further circuit is functionally identical to the circuit arrangement and the outputs of the further circuit, with inputting of the binary values x1', ..., xn', carry the values c1', ..., cm'. A comparator is provided, in which the output signals c1, ..., cm of the circuit arrangement and the output signals c1', ..., cm' of the further circuit are compared.

A further aspect of the invention provides a method for generating at least one check bit that can be evaluated for error detection for a circuit arrangement, in which at least one check bit c1, ..., cm (m≧1) is generated from n (n≧2) information bits x1, ..., xn. The at least one check bit ci for i=1, ..., m is generated in accordance with a Boolean function ci=fi(xi1, ..., xini), wherein the set {xi1, ..., xini} of the ni information bits is a subset of all n information bits {x1, ..., xn}. The at least one first check bit c1 is generated in accordance with a first Boolean function f1 (x11, ..., x1n1) of the form c1=f1 (x11, ..., x1n1)=f11(x11, x12)XOR f12(x13, x14) XOR ... XOR f1k1(x1(n1−1), x1n1). n1 is an even number where n1≧2 and 2 k1=n1 and the Boolean functions f11(x11, x12), ..., f1k1(x1(n1−1), x1n1) are non-linear Boolean functions of two variables which each have a controlling value c11, ..., c1k1.

In this way, technologies in conjunction with digital circuit arrangements are defined that can be implemented in various embodiments with the aid of hardware and/or software components which, for their part, are readily known to the person skilled in the art. The circuit arrangement is defined structurally and functionally. It can be implemented and optimized in various ways, for example, using CAD tools for circuit optimization, which are readily known as such to the person skilled in the art, for example, with regard to the area outlay and the signal delays.

In one configuration, an embodiment of the invention encompasses the concept of the data/information bits for deriving at least one first check bit firstly being logically combined in pairs by means of a logic gate having two inputs and one output, wherein each of these gates realizes a non-linear two-digit Boolean function with a controlling value. The n/2 outputs of these n/2 gates are XORed in order to determine at least one first check bit. Thus, an overall nonlinear Boolean function is realized for determining at least the first check bit. As a result, it is possible to detect all odd errors and a plurality of even errors at least with the probability 1/2 already at a single output, which has not been known heretofore.

By adding further check bits and using different logic gates having two inputs and one output for deriving further check bits, advantageous embodiments of the invention arise, wherein the errors can be detected from changes in the check bits. Thus, by way of example, a circuit for generating only two check bits permits the detection of practically all errors with at least the probability 1/2 from changes in the check bits.

A circuit with three check bits permits the detection of all odd errors and all adjacent 2-bit errors with certainty and detection of a plurality of further even errors with at least the probability 1/2.

An advantageous feature in one preferred configuration of the invention is that the parity of the information bits does not have to be realized directly at a single output by a linear function, but rather is realized in "split" fashion at a subset of the m outputs of the circuit for determining the m check bits. This subset of the outputs contains at least two outputs which each realize a nonlinear Boolean function of the information bits. The XOR sum of the outputs of this subset mathematically produces the parity of the information bits, wherein the XOR sum of the outputs of this subset of the outputs does not have to be realized as hardware. The described property of the outputs guarantees that, as in the case of a parity code, all one-bit errors and all odd errors can be detected. By virtue of the fact that instead of the parity, at least two nonlinear functions of the information bits and, if appropriate, further functions are realized at the outputs of a circuit which (mathematically) form the parity of the information bits as an XOR sum, in comparison with the parity more information about possible errors is output by the circuit for determining the m check bits, which surprisingly permits the detection of, in addition to all the odd errors, also once again a plurality of even errors at least with probability 1/2 and in specific advantageous configurations of the invention with certainty. Thus, by way of example, in a specific configuration with only three check bits, not only all odd errors but also all adjacent 2-bit errors are detected even with certainty. Practically all errors having an even number of erroneous bits are detected at least with the probability 1/2 in advantageous configurations.

If an arbitrary error is permanently present, by way of example, then it is detected with at least the probability 1/2 in each clock cycle and detected with the probability:

$$1 - \left(\frac{1}{2}\right)^{10} \approx 1$$

In, for example, T=10 clock cycles. If an arbitrary error occurs in volatile fashion, then, owing to the high clock rates of modern computing systems, it is likewise detected practically with certainty or with high probability.

The number of check bits is independent of the number n of information bits, and the number of check bits does not increase with an increasing number of data bits. If all adjacent 2-bit errors are to be detected with certainty, then a Hamming code, which solves this task for 128 bits or 16 bytes, requires eight check bits and hence eight circuit outputs, while one advantageous configuration of the circuit according to an embodiment of the invention has only three outputs for the check bits.

One specific configuration with four check bits even permits the detection of, in addition to all odd errors, all errors of the information bits which consist of up to seven adjacent individual errors, with certainty.

The various embodiments of circuits according to the invention implement methods or processes for generating check bits which serve for error detection, wherein a combinational circuit having n binary inputs E1, ..., En for inputting n (n≧2) information bits x1, ..., xn and m binary outputs for outputting m (m≧1) check bits c1, ..., cm is utilized in one embodiment. The check bits are generated by the circuit elements implementing defined functions according to which the binary input data are processed.

BRIEF DESCRIPTION OF THE DRAWINGS

The invention is explained in more detail below on the basis of exemplary embodiments with reference to figures of a drawing, in which.

DESCRIPTION OF EXEMPLARY EMBODIMENTS OF THE INVENTION

Figure 1:
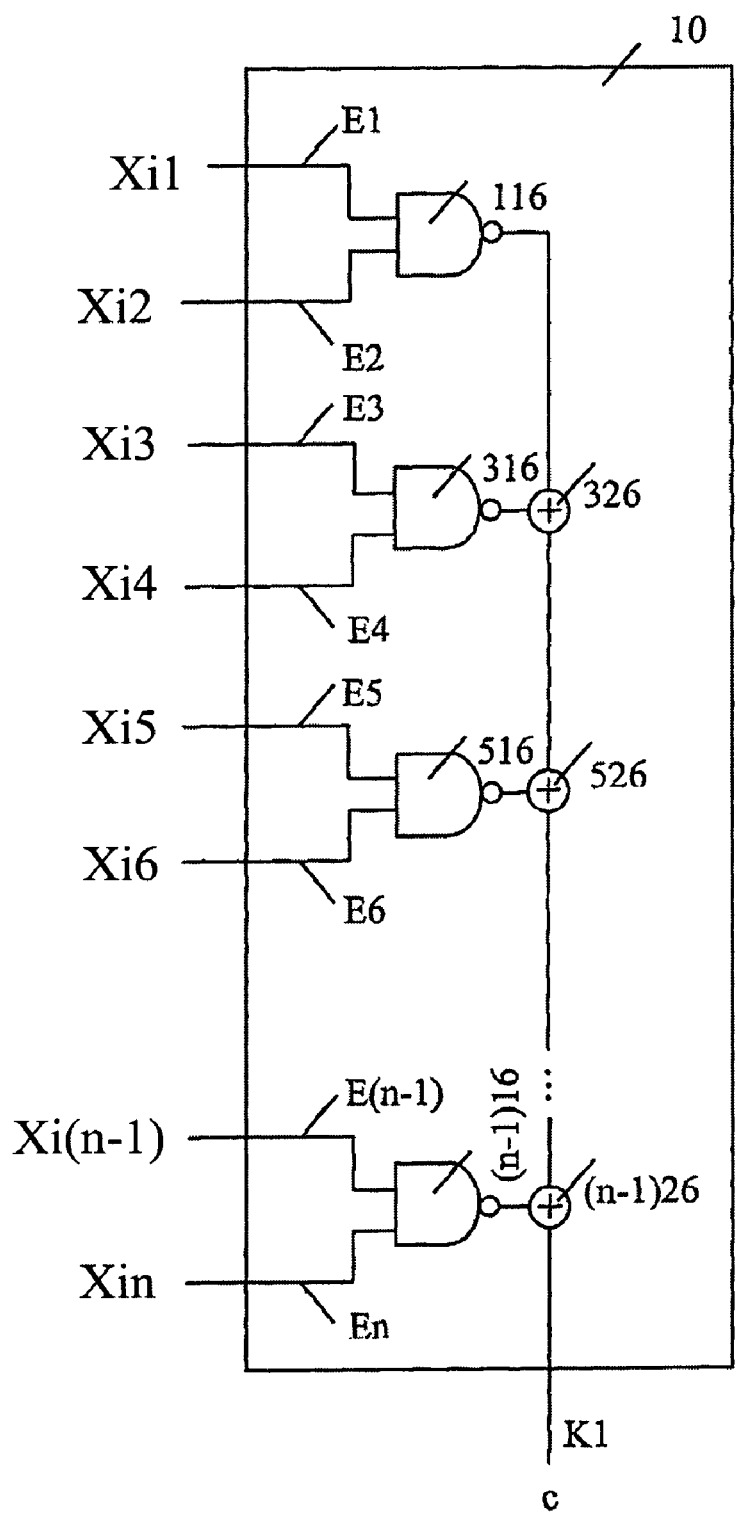
FIG. 1 shows a circuit according to an embodiment of the invention for generating a single check bit from n information bits.

FIG. 1 shows a circuit diagram of a circuit 10 according to an embodiment of the invention for determining one check bit c from n information or data bits $xi1, \ldots, xin$. n is an even number.

The circuit 10 in FIG. 1 has n inputs $E1, \ldots, En$ and one check signal output K1, which outputs the check bit c. The information bits $xi1, \ldots, xin$ are present at the inputs $E1, \ldots, En$. For $j=1, 3, 5, \ldots, n-1$, the input Ej is connected to the first input of a NAND gate j16 while the input E(j+1) is connected to the second input of the gate.

The output of the NAND gate 116 is led into the first input of an XOR gate 326. For $j=3, 5, \ldots, n-3$, the output of the XOR gate j26 is connected to the first input of a further XOR gate (j+2)26. For $j=3, 5, \ldots, n-1$, the output of the NAND gate j16 is connected to the respective second input of the XOR gate j26. The output of the XOR gate (n−1)26 is the check signal output K1, which carries the check signal c.

In the manner described, the check signal c is realized by a combinational circuit 10 constructed from the NAND gates i16 for $i=1, 3, 5, \ldots, n-1$ and the XOR gates j26 for $j=3, 5, \ldots, n-1$.

The NAND gates $116, 316, \ldots, (n-1)16$ are gates having a controlling value 0. If the controlling value 0 is present at one input of a NAND gate, then the NAND gate outputs the value 1 independently of the value present at the other input. If the non-controlling value 1 is present at one input of a NAND gate, then it outputs the value 0 or 1 depending on whether the value 1 or 0 is present at the other input.

Other gates having a controlling value 0, 1 and 1 are AND, OR and NOR gates.

In a manner analogous to that for a NAND gate, the following holds true for an AND, OR and NOR gate: if the controlling value 0 is present at one input of an AND gate, then the AND gate outputs the value 0 independently of the value present at the other input of the AND gate. If the controlling value 1 is present at one input of an OR gate, then the OR gate outputs the value 0 independently of the value present at the other input of the OR gate. If the controlling value 1 is present at one input of a NOR gate, then the NOR gate outputs the value 0 independently of the value present at the other input of the AND gate.

The detection of errors in the information or data bits $xi1, \ldots, xin$ on the basis of alterations in the check bit c will now be explained.

As a first error we will consider an error in which the correct inputting $xi1$ is disturbed so as to become the erroneous inputting $\overline{xi3}$. The erroneous value $\overline{xi3}$ is present at the input E3 connected to the first input of the NAND gate 316.

Depending on the value $xi4$ present at the input E4 connected to the second input of the NAND gate 316, the erroneous value $\overline{xi3}$ leads to a change in the check bit c. If $xi4$ assumes the controlling value 0 of the NAND gate 316, then the NAND gate 316 outputs the value 1 independently of the value present at its first input, which value 1 then is present at the second input of the XOR gate 326 and the error under consideration cannot affect the check signal c.

If, however, $xi4$ assumes the non-controlling value 1 of the NAND gate 316, then the error under consideration leads to a change in the check signal c and it can be detected on the basis of this change. Instead of the value $\overline{xi3}$ in the correct case, the NAND gate 316 then outputs in the erroneous case the value $xi3$, which is input into the second input of the XOR gate 326 and has an effect via the XOR gates $326, 526, \ldots (n-1)26$ as a change in the check bit c.

If it is realistically assumed that $xi4$ assumes the value 0 and the value 1 in each case approximately equally often or equiprobably in each case with the probability 1/2, then the error $xi3$ disturbed to become $\overline{xi3}$ is detected with the probability 1/2 from a change in the check bit c.

The 2-bit error $xi2$ disturbed to become $\overline{xi2}$ and $xi5$ disturbed to become $\overline{xi5}$ will now be considered. The error $xi2$ disturbed to become $\overline{xi2}$ has an effect at the output of the NAND gate 116 if $xi1$ assumes the value 1, and it does not have an effect if $xi1$ assumes the value 0.

The error $xi5$ disturbed to become $\overline{xi5}$ has an effect at the output of the NAND gate 516 if $xi6$ assumes the value 1, and it does not have an effect if $xi6$ assumes the value 0.0 is the controlling value of a NAND gate and 1 is the non-controlling value of a NAND gate.

The outputs of the NAND gates $116, 316, \ldots, (n-1)16$ are XORed by the XOR gates $326, 526, \ldots, (n-1)26$ in order to form the check bit c. Therefore, the error $xi2$ disturbed to become $\overline{xi2}$ and $xi5$ disturbed to become $\overline{xi5}$ then has an effect at the output K1 in a change in the check bit c if either $xi2$ disturbed to be $\overline{xi2}$ has an effect at the output of the NAND gate 316 or $xi5$ disturbed to become $\overline{xi5}$ has an effect at the output of the NAND gate 516. That is the case precisely when the controlling value 0 is present at one of the inputs E1 or E6 and the non-controlling value 1 is present at the other of the two inputs. If the non-controlling value 1 is present at both inputs, then the two erroneous outputtings of the NAND gates 116 and 516 are compensated for by the XOR combination. If the controlling value 0 is present at both inputs, then no erroneous values are output by the NAND gates 116 and 516. The error under consideration is therefore detected from a change in the check bit c precisely when $xi1=1$ and $xi6=0$ or $xi1=0$ and $xi6=1$.

If it is again realistically assumed that the input signals 0 and 1 occur in each case with equal probability, then this 2-bit error is detected with the probability. It can analogously be shown that every odd error is detected with the probability 1/2 from a change in the check bit c.

A plurality of even errors are likewise detected with the probability 1/2 from a change in the check bit c.

In order to further illustrate the properties of the circuit 10 according to an embodiment of the invention as shown in FIG. 1, it will now be compared with the circuit that generates the parity bit as a check bit.

In the case of parity bit generation, as is known, all the inputs of the circuit under consideration are XORed to form a check bit, which is called the parity bit, where it is known that XOR gates do not have a controlling value.

Any odd error at the circuit inputs is detected with the probability 1 from a change in the parity bit. By contrast, any even error is never detected from the change in the parity bit. If an even error occurs, then it always remains undiscovered in the case of checking by means of a parity bit.

The case will be considered in which a digital circuit S is connected upstream of the circuit 10 from FIG. 1, such that the outputs of the circuit S connected upstream are connected to the inputs of the circuit 10 from FIG. 1. The circuit S is not depicted in FIG. 1.

If technical-physical errors occur in the circuit S, then in many circuits there are also such technical-physical errors which always lead to even errors of the bits at the outputs of S. Errors of this type can never be detected by parity bit checking, whereas errors of this type are detected with the probability 1/2 in each clock cycle by means of the circuit 10 from FIG. 1. If the error is permanent, then it is detected in L successive clock cycles with the probability $$1 - \left(\frac{1}{2}\right)^L$$

A probability 1 of an error of this type being detected arises in practice already for L=10. If the error under consideration is not permanent but is present for at least K clock cycles, then the probability of the error being detected is equal to $$1 - \left(\frac{1}{2}\right)^K.$$

In this case, the outlay for error detection in the circuit according to an embodiment of the invention is even lower than in the case of error detection by parity. In the case of error detection by parity, the NAND gates 116, 316, . . . , (n−1)16 would have to be replaced in each case by XOR gates, where NAND gates generally require less outlay than XOR gates.

Figure 2:
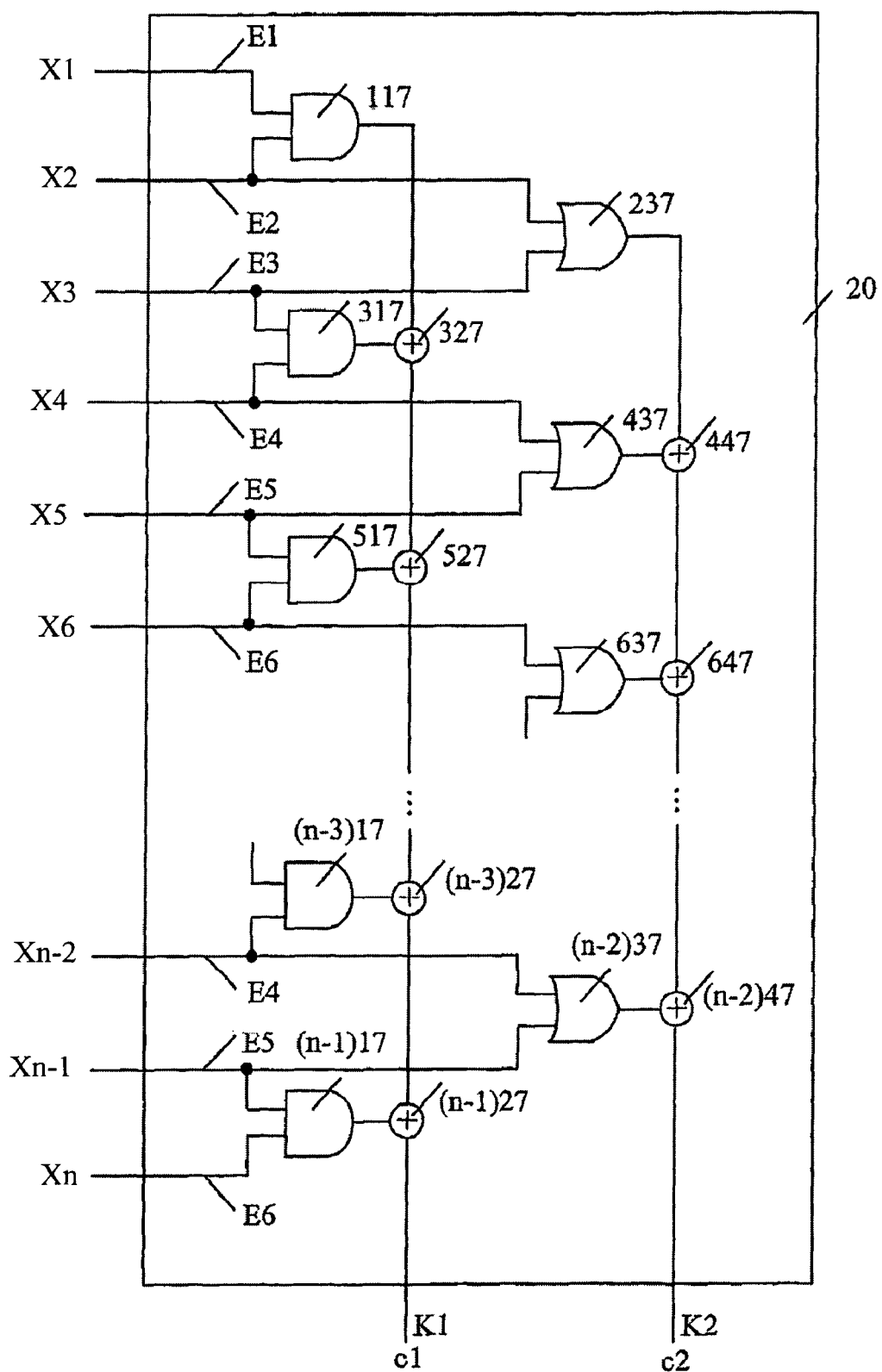
FIG. 2 shows a circuit according to an embodiment of the invention for generating two check bits from n information bits.

FIG. 2 shows a circuit diagram of a circuit 20 according to an embodiment of the invention for determining two check bits c1 and c2 from n information or data bits x1, . . . , xn. n is an even number. The circuit 20 in FIG. 2 has n inputs E1, . . . , En and two check signal outputs K1 and K2, which carry the check signals c1 and c2. The information bits x1, . . . , xn are present at the inputs E1, . . . , En.

For j=1, 3, 5, . . . , n−1, the input Ej is connected to the first input of an AND gate j17, while the input E(j+1) is connected to the second input of the AND gate j17. The output of the AND gate 117 is led into the first input of an XOR gate 327. For j=3, 5, . . . , n−3, the output of the XOR gate j27 is connected to the first input of a further XOR gate (j+1)27. For j=3, 5, . . . n−1, the output of the AND gate j17 is connected to the respective second input of the XOR gate j27.

The output of the XOR gate (n−1)27 is the check output K1, which carries the check signal c1. Furthermore, for k=2, 4, . . . , n−2, the input Ek is connected to the first input of an OR gate k37, while for k=2, 4, . . . , n−2, the input E(k+1+) is connected to the second input of the OR gate k37. The output of the OR gate 237 is connected to the first input of an XOR gate 447, into the second input of which the output of the OR gate 437 is led.

For k=4, 6, . . . , n−4, the output of the XOR gate k47 is connected to the first input of a further XOR gate (k+2)47, into the second input of which the output of the OR gate (k+2)47 is led. The output of the XOR gate (n−2)47 is the check signal output K2, which carries the check signal c2.

In the manner described, the check signal c1 is realized by a combinational circuit SI constructed from the AND gates i17 for i=1, 3, 5, . . . , n−1 and the XOR gates j27 for j=3, 5, . . . , n−1.

The check signal c2 is correspondingly realized by a combinational circuit S2 constructed from the OR gates k37 for k=2, 4, 6, . . . , n−2 and the XOR gates j47 for j=4, 6, . . . , n−2. The circuits S1 and S2 form the circuit 20.

The output K2 that realizes the check signal c2 depends on a subset of the information bits, on the information bits x2, x3, . . . , x(n−1).

The circuit from FIG. 2 surprisingly permits the detection of an arbitrary even or odd error at the inputs of the circuit from FIG. 2 which does not corrupt all n bits simultaneously, at least with the probability 1/2 from a change in at least one of the check bits c1 or c2.

The error detection by means of the check bits of the circuit 20 according to FIG. 2 will now be explained in more detail using an example.

A 4-bit error is considered such that x1, x2, x5, x6 is disturbed to become $\bar{x}1\ \bar{x}2\ \bar{x}5\ \bar{x}6$. Instead of the correct value x1x2, the AND gate 117 outputs the value $\bar{x}1\ \bar{x}2$ and the AND gate 517 outputs the value x5x6 instead of the correct value $\bar{x}5\ \bar{x}6$. x1x2 XOR $\bar{x}1\bar{x}2$=1 XOR x1 XOR x2 and x5x6 XOR $\bar{x}5\ \bar{x}6$=1 XOR x5 XOR x6 hold true, as is evident most simply from the truth tables of the corresponding Boolean functions.

Since the outputs of the AND gates 117 and 517 are XORed to form the check signal c1 and no erroneous signals are output at the outputs of the further AND gates j17 for j not equal to 1 and 5, the error under consideration is then detected at the output K1 if 1 XOR x1 XOR x2 XOR 1 XOR x5 XOR x6=x1 XOR x2 XOR X5 XOR x6=1 is satisfied.

If x1 XOR x2 XOR x5 XOR x6=0, then this error is not detected at the output K1.

However, the error under consideration still has an effect at the outputs of the following OR gates:

at the output of the OR gate 237 if x3 assumes the non-controlling value 0, at the output of the OR gate 437 if x4 assumes the non-controlling value 0, at the output of the OR gate 637 if x7 assumes the non-controlling value 0.

The error does not have an effect at the outputs of the OR gates if the corresponding information bits x3, x4, x7 assume the controlling value 1.

Since the outputs of the OR gates 237, 437, 637 and (n−2)37 are XORed in order to form the check bit c2 at the check bit output K2, the error has an effect at the check signal output K2 precisely when an odd number of information bits x3, x4, x7 is equal to 1. That is the case for half of all possible allocations of these information bits, such that given equal probability of the occurrence of the values 0 and 1 for the information bits the probability of 1/2 results for the detection of the error under consideration solely at the check bit output K2. It is wholly analogously evident for every possible error that does not simultaneously corrupt all n information bits that it is detected with the probability 1/2 either at the output K1 or at the output K2.

Figure 3:
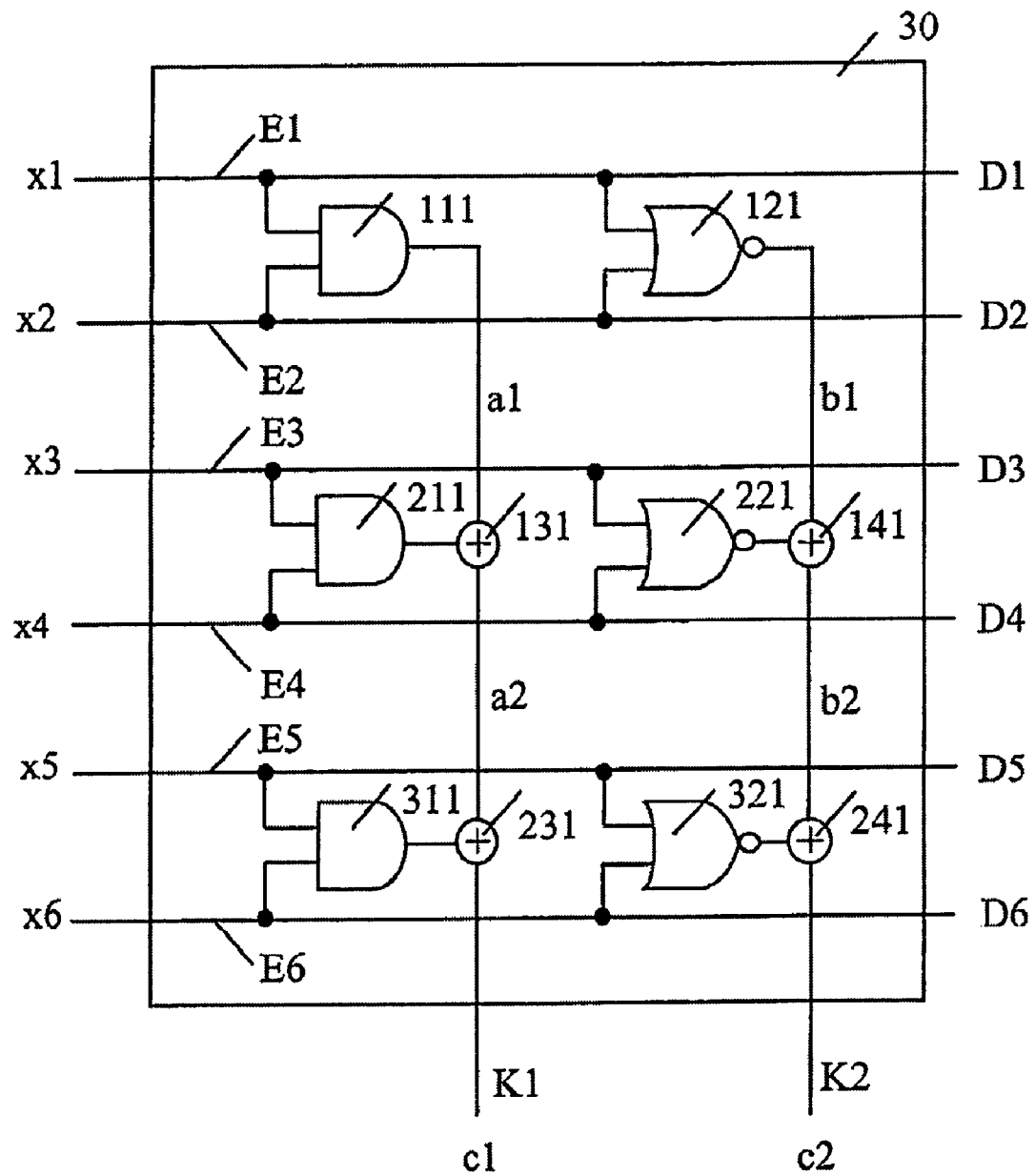
FIG. 3 shows a circuit according to an embodiment of the invention for generating m=2 check bits from n=6 data bits.

FIG. 3 shows a circuit diagram of a circuit 30 according to an embodiment of the invention for determining two check bits c1 and c2 from n=6 information bits x1, x2, x3, x4, x5, x6, present at the inputs E1, E2, . . . , E6 of the circuit 30. The data present at the inputs E1, . . . , E6 are output unchanged at the data outputs D1, D2, . . . , D6 of the circuit 30. The check bits c1 and c2 determined by the circuit 30 are provided at the two check signal outputs K1 and K2.

Circuit inputs E1 and E2 are combined with the two inputs of an AND gate 111 and with the two inputs of a NOR gate 121. The output of the AND gate 111, which carries the signal a1, is led into the first input of an XOR element 131, while the output of the NOR gate 121, which carries the signal b1, is led into the first input of an XOR gate 141.

Circuit inputs E3 and E4 are combined with the two inputs of an AND gate 211 and with the two inputs of a NOR gate 221. The output of the AND gate 211 is led to the second input of the XOR element 131, the output of which, the output carrying the signal a2, is connected to the first input of an XOR gate 231. The output of the NOR gate 221, which is led into the second input of the XOR gate 141, the output of which carries the signal b2, is connected to the first input of an XOR gate 241.

The circuit inputs E5 and E6 are combined with the two inputs of an AND gate 311 and with the two inputs of a NOR gate 321. The output of the AND gate 311 is led to the second input of the XOR element 231, the output of which is connected to the output K1. This output carries the check bit c1. The output of the NOR gate 321 is led into the second input of the XOR gate 241, the output of which is connected to the output K2. This output carries the check bit c2.

The check bit c1 output at the output K1 has the value c1=f1(x1, x2, . . . , x6)=(x1 x2) XOR (x3 x4) XOR (x5 x6), and the check bit c2 output at the output K2 has the value c2=f2(x1, x2, . . . , x6)=(x1 NOR x2) XOR (x3 NOR x4) XOR (x5 NOR x6).

The following hold true: f11(x1, x2)=x1x2, f21(x1, x2)= (x1 NOR x2), . . . , F13(x5, x6)=x5x6, f23(x5, x6)=(x5 NOR x6) and f1(x1, . . . , x6)=f11(x1, x2) XOR f12(x3, x4) XOR f13(x5, x6), f2(x1, . . . , x6)=f21(x1, x2) XOR f22(x3, x4) XOR f23(x5, x6).

It is directly apparent that the two functions f1 and f2 are nonlinear.

The following holds true: (xi xj) XOR (xi NOR xj)=xi XOR xj XOR 1, which can be checked very simply by means of direct verification using a truth table. Since, moreover, 1 XOR 1=0, this results in c1 XOR c2=x1 XOR x2 XOR x3 XOR x4 XOR x5 XOR x6 XOR 1, and the XOR combination at the two outputs K1 and K2 mathematically produces the negated parity of the values x1, x2, x3, x4, x5, x6, present at the circuit inputs E1, E2, E3, E4, E5, E6. According to an embodiment of the invention, the XOR combination of the check bit outputs K1 and K2 need not, however, be embodied as hardware.

Since the negated parity of the information bits is obtained by XOR combination of the check bits c1 and c2, any change in the parity of these bits as a result of erroneous input signals x1', . . . x6' can be detected from the corresponding changes in the check signals c1 and c2.

A plurality of 2-bit errors in the data word x1, x2, x3, x4, x5, x6 can be detected from the changes in the check bits.

As the first 2-bit error, a 2-bit error is considered in which, instead of the correct bits x2 and x3, the erroneous bits $\bar{x}3$ and $\bar{x}2$ are input into the circuit 20 according to FIG. 3. All the other bits x1, x4, x5, x6, x7, x8 shall not change.

In the error-free case, the AND gates 111 and 211 output the values x1x2 and x3x4. If the assumed error is present, then the AND gate 111 outputs the value x1 $\bar{x}2$, which differs from the correct value by x1. The AND gate 211 outputs the value $\bar{x}3$ x4, which differs from the correct value by x4. It is evident that the error under consideration alters the check signal c1 when x1 XOR x4=1.

In the error-free case, the NOR gate 121 outputs the value x1 NOR x2 and, in the case of an error, it outputs the value x1 NOR $\bar{x}2$, which differs from the error-free case by x1. The NOR gate 221 outputs the value x3 NOR x4 in the error-free case. If the assumed error is present, then the NOR gate 221 outputs the value $\bar{x}3$ NOR x4, which differs from the correct value by x4, as can be verified most simply on the basis of the truth tables of the functions used. It is evident that the error under consideration alters the check signal c2 when x1 XOR x4=1. This error can thus be detected both at the output K1 and at the output K2 from the altered check bits if x1 XOR x4=1. It is not detected if x1 XOR x4=0. Assuming that all possible values are present with equal frequency as input at the circuit SKB from FIG. 3, the error is detected with the probability 1/2.

As a second 2-bit error, consideration is given to such a 2-bit error in which the inverted bits $\bar{x}3$, $\bar{x}4$ are present instead of the correct bits x3 and x4.

The output of the AND gate 211 outputs x3 x4 in the error-free case and, in the case of an error, the value $\bar{x}3$ $\bar{x}4$, which differs from the correct value by 1 XOR x3 XOR x4.

The output of the NOR gate 221 outputs the value x3 NOR x4 in the error-free case and $\bar{x}3$ NOR $\bar{x}4$ in the case of the error under consideration, such that the value at the output of this gate is likewise by 1 XOR x3 XOR x4 in the case of an error. The 2-bit error is detected if x3 XOR x4=0 holds true, that is to say if x3=x4 and the error is unidirectional. In this case, a unidirectional error is such an error in which all the erroneous bits are altered in the same direction, either all from 0 to 1 or all from 1 to 0.

It is evident in the same way that all adjacent n/2=k 2-bit errors at the inputs E(2k−1), E2k, k=1, 2, . . . are always detected if they are unidirectional and that all other $$\binom{n}{2} - n/2 = n(n-1) - n/2$$

2-bit errors are detected with the probability 1/2.

If the two outputs K1 and K2 were combined by an XOR gate to form a single output that realizes the parity of the data bits x1 XOR . . . XOR x6, then no 2-bit errors at all could be detected at this output.

Figure 4:
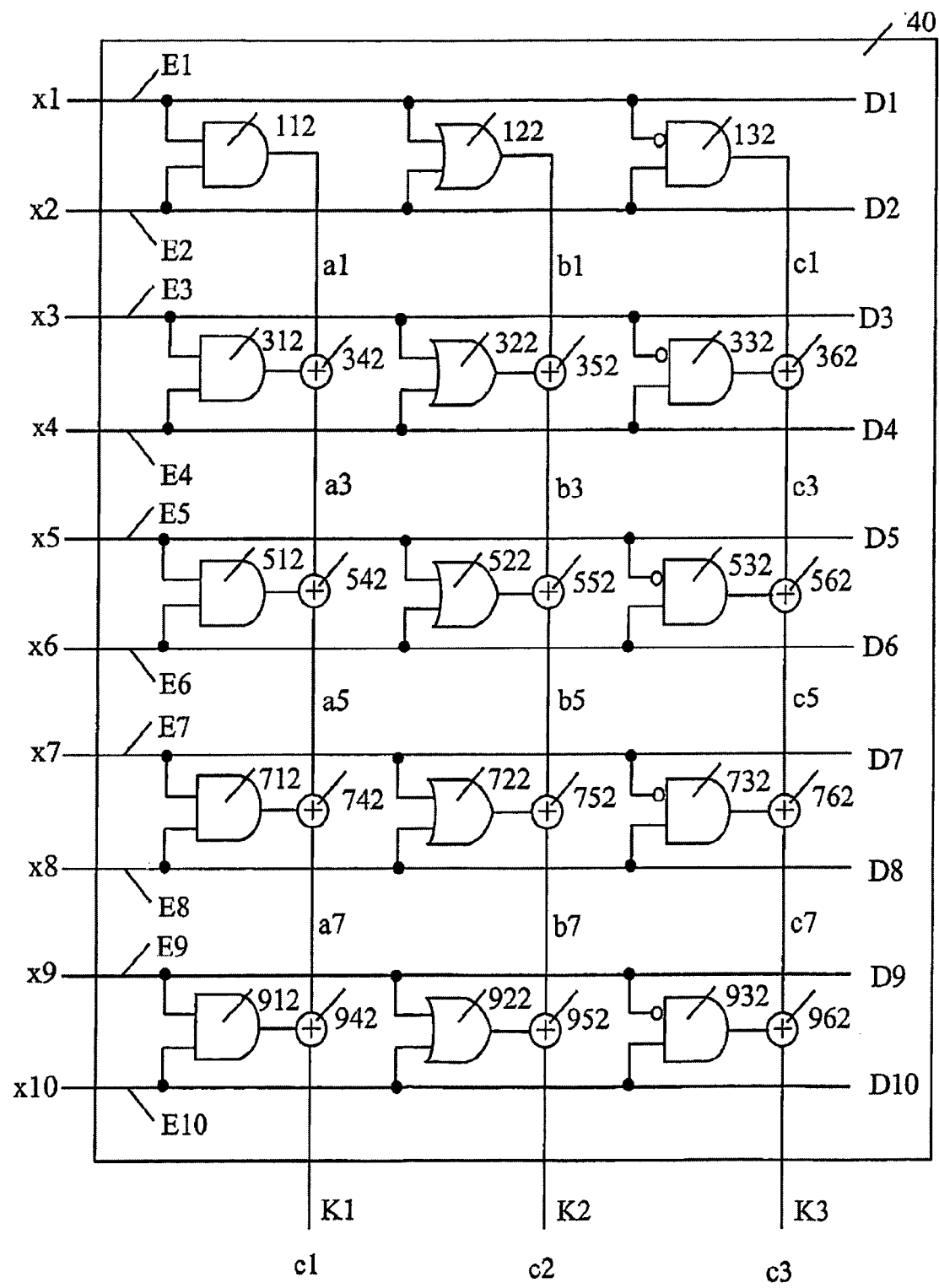
FIG. 4 shows a circuit according to an embodiment of the invention for generating m=2 check bits from n=10 data bits.

FIG. 4 shows a circuit diagram of a circuit 40 according to an embodiment of the invention for determining three check bits c1, c2 and c3 from n=10 information bits x1, x2, x3, x4, x5, x6, x7, x8, x9, x10 present at the ten inputs E1, E2, . . . , E8, E9, E10 of the circuit 40. The data present at inputs E1, . . . , E10 are output unchanged at data outputs D1, . . . , D10 of the circuit 40. The check signals c1, c2 and c3 determined by the circuit 40 are provided at three outputs K1, K2 and K3 for determining the check bits.

The circuit inputs E1 and E2 are combined with the two inputs of an AND gate 112, with the two inputs of an OR gate 122 and with the two inputs of a further AND gate 132. The first input, connected to E1, of the AND gate 132 is negated.

The output of the AND gate 112, which carries the signal a1, is led into the first input of an XOR element 342, while the output of the OR gate 122, which carries the signal b1, is led into the first input of an XOR gate 352. The output of the AND gate 132, which carries the signal c1, is led into the first input of a further XOR gate 362.

For i=3, 5, 7 and 9, the circuit inputs Ei and E(i+1) are connected to the two inputs of an AND gate i12, to the two inputs of an OR gate i22 and to the two inputs of a further AND gate i32. The first input—connected to Ei—of the gate i32 is negated.

The output of the AND gate i12 is led into the second input of the XOR gate i42, wherein for i=3, 5, 7 the output of the XOR gate, which output carries the signal ai, is connected to the first input of a further XOR gate (i+2)42.

The output of the OR gate i22 is led into the second input of the XOR gate i52, where for i=3, 5, 7 the output of the XOR gate, which output carries the signal bi, is connected to the first input of a further XOR gate (i+2)52. The output of the AND gate i32, whose first input, connected to Ei, is negated, is led into the second input of the XOR gate i62, wherein for I=3, 5, 7 the output of the XOR gate, which output carries the signal ci, is connected to the first input of a further XOR gate (i+2)62.

The output of the XOR gate 942 is the first output K1 for the check signal c1. The output of the XOR gate 952 is the second output K2 for the check signal c2. The output of the XOR gate 962 is the third output K3 for the check signal c3.

If the outputs K1, K2, which form a genuine subset of the outputs K1, K2, K3, are then combined mathematically by the XOR combination, the parity of the information bits $x_1, \ldots, x_{10}$ present at the inputs E1, ..., E10 results, as will now be explained.

The check signal c1 output at the output K1 has the value c1=f1(x1, x2, ..., x10)=(x1 x2) XOR (x3 x4) XOR (x5 x6) XOR (x7 x8) XOR (x9 x10), and the check signal c2 output at the output K2 has the value c2=f2(x1, x2, ..., x10)=(x1 OR x2) XOR (x3 OR x4) XOR (x5 OR x6) XOR (x7 OR x8) XOR (x9 OR x10).

It can easily be seen that the two functions f1 and f2 are nonlinear.

Since (xi xj) XOR (xi OR xj)=xi XOR xj holds true, as can be checked most simply by direct verification using a truth table, the following holds true: c1 XOR c2=x1 XOR x2 XOR x3 XOR x4 XOR x5 XOR x6 XOR x7 XOR x8 XOR x9 XOR x10, and the XOR combination of the two outputs K1 and K2 mathematically produces the parity of the values x1, x2, x3, x4, x5, x6, x7, x8, x9, x10 present at the circuit inputs E1, E2, E3, E4, E5, E6, E7, E8, E9, E10.

According to an embodiment of the invention, the XOR combination of the check bit outputs K1 and K2 need not, however, be embodied as hardware.

Since the parity is obtained by means of XOR combination of the check bits c1 and c2, any change in the parity as a result of erroneous input signals x1', ..., x8' can be detected from the corresponding changes in the check signals c1 and c2.

It is now possible always to detect all adjacent 2-bit errors in the input values x1, ..., x10 at the check bit outputs K1, K2, K3 determined in accordance with the circuit 40 from FIG. 4. These facts will now be explained using two examples.

In the first example we assume that instead of the correct values x1 and x2, the erroneous values $\overline{x1}$ and $\overline{x2}$ are present at the inputs E1 and E2. All other input values shall be correct unchanged.

In the error-free case the following holds true:
a1=x1 x2, b1=x1 OR x2, c1=$\overline{x1}$ x2
and in the case of the error under consideration, the following hold true:
a1'=$\overline{x1}$ $\overline{x2}$=a1 XOR 1 XOR x1 XOR x2,
b1'=($\overline{x1}$ OR $\overline{x2}$)=a2 XOR 1 XOR x1 XOR x2,
c1'=x1 OR $\overline{x2}$)=a3 XOR x1 XOR x2.

Since either x1 XOR x2 or 1 XOR x1 XOR x2 is 1, either a1 and b1 or c1 are altered by the error under consideration, and the error under consideration is always detected since it affects either the two outputs K1 and K2 or the output K3.

In the second example we assume that instead of the correct values x2 and x3, the erroneous values $\overline{x2}$ and $\overline{x3}$ are present at the inputs E2 and E3. All other input values shall be correct unchanged.

In the error-free case, the following then hold true:
a3=(x1 x2) XOR (x3 x4),
b3=(x1 OR x2) XOR (x3 OR x4),
c3=$\overline{x1}$ x2) XOR ($\overline{x3}$ x4),
and in the case of the error under consideration, the following hold true:
a3'=(x1 $\overline{x2}$) XOR($\overline{x3}$ x4)=a3 XOR x1 XOR x4
b3'=(x1 OR $\overline{x2}$) XOR ($\overline{x3}$ OR x4)=b3 XOR x1 XOR x4
c3'=(x1 x2 XOR (x3 x4)=c3 XOR 1 XOR x1 XOR x4.

Since either x1 XOR x4 or 1 XOR x1 XOR x4 is equal to 1, either a3 and b3 or c3 are altered by the error under consideration, and the error under consideration is always detected since it affects either the two outputs K1 and K2 or the output K3.

Figure 5:
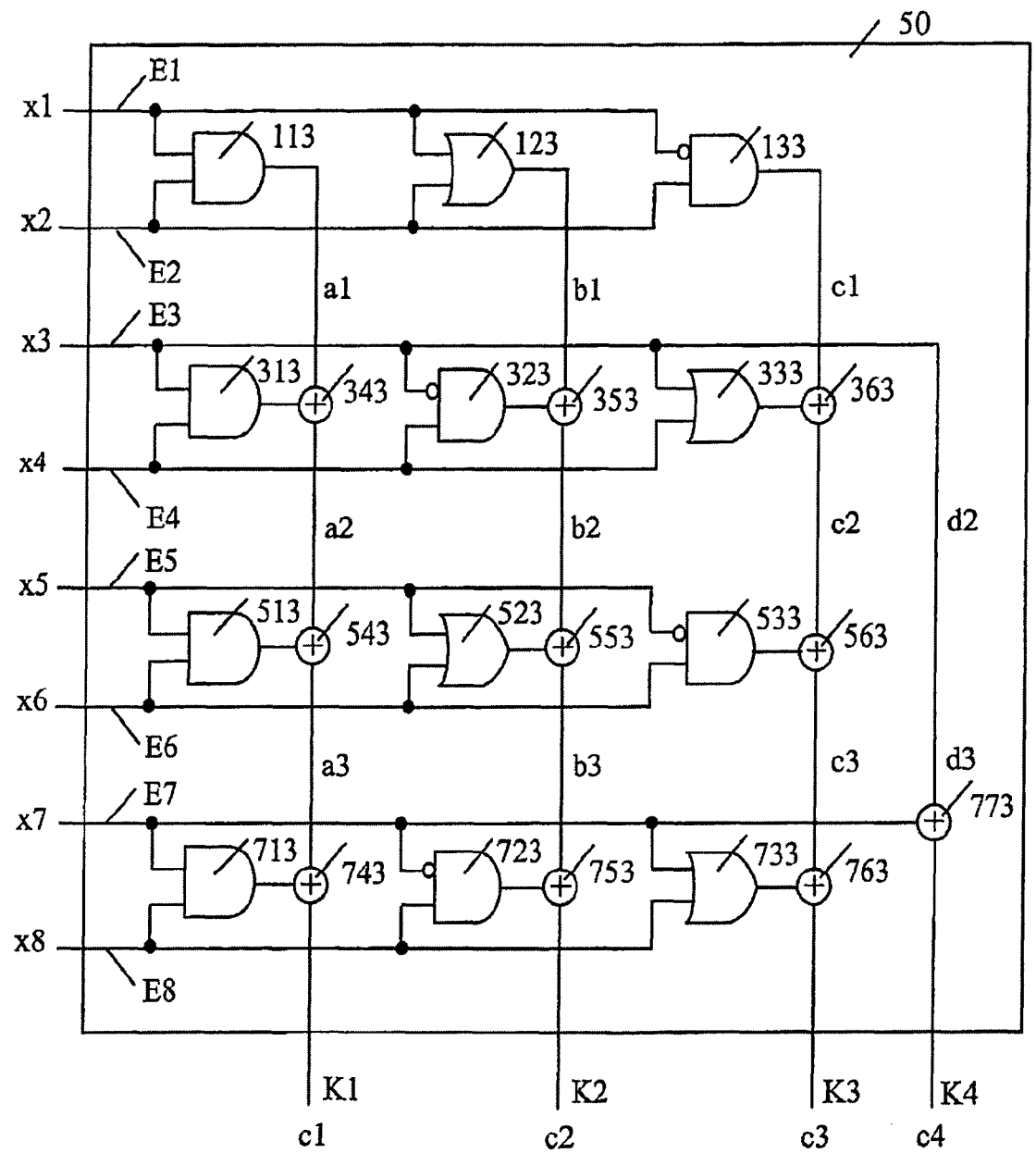
FIG. 5 shows a circuit according to an embodiment of the invention for generating m=4 check bits from n=8 data bits.

FIG. 5 shows a circuit diagram of a circuit 50 according to an embodiment of the invention for determining four check bits c1, c2, c3 and c4 from n=8 information bits x1, x2, x3, x4, x5, x6, x7, x8 present at eight inputs E1, E2, ..., E8 of the circuit 50. The check bits c1, c2, c3 and c4 determined by the circuit 50 are provided at the four check signal outputs K1, K2, K3 and K4.

The circuit inputs E1 and E2 are connected to the two inputs of an AND gate 113, to the two inputs of an OR gate 123 and to the two inputs of a further AND gate 133. The first input, connected to E1, of the AND gate 133 is negated.

The output of the AND gate 113, which carries the signal a1, is led into the first input of an XOR gate 343. The output of the XOR gate 343, which carries the signal a2, is led into the first input of a further XOR gate 543. The output of the OR gate 123, which carries the signal b1, is led into the first input of an XOR gate 353. The output of the XOR gate 353, which carries the signal b2, is connected to the first input of a further XOR gate 553. The output of the AND gate 133, which carries the signal c1, is led into the first input of a further XOR gate 363. The output of the XOR gate 363, which carries the signal c2, is connected to the first input of a further XOR gate 563.

The circuit inputs E3 and E4 are connected to the two inputs of an AND gate 313, to the two inputs of an OR gate 333 and to the two inputs of a further AND gate 323. The first input of the AND gate 323, which is connected to E3, is negated.

The output of the AND gate 313 is led into the second input of the XOR gate 343. The output of the AND gate 323 is led into the second input of an XOR gate 353. The output of the OR gate 333 is led into the second input of an XOR gate 363.

The circuit inputs E5 and E6 are combined with the two inputs of an AND gate 513, with the two inputs of an OR gate 523 and with the inputs of a further AND gate 533, whose first input—connected to E5—is negated. The output of the AND gate 513 is led into the second input of the XOR gate 543. The output of the XOR gate 543, which carries the signal a3, is led into the first input of a further XOR gate 743.

The output of the OR gate 523 is led into the second input of an XOR gate 553. The output of the XOR gate 553, which carries the signal b3, is led into the first input of a further XOR gate 753. The output of the AND gate 533 is led into the second input of an XOR gate 563. The output of the XOR gate 563, which carries the signal c3, is led into the first input of a further XOR gate 763.

The circuit inputs E7 and E8 are combined with the two inputs of an AND gate 713, with the two inputs of an OR gate 733 and of a further AND gate 733, whose first input, connected to E7, is negated. The output of the AND gate 713 is led into the second input of the XOR gate 743. The output of the XOR gate 743 is connected to the output K1, which carries the check bit c1.

The output of the AND gate 723 is led into the second input of the XOR gate 753. The output of the XOR gate 753 is connected to the output K2, which carries the check bit c2. The output of the OR gate 733 is led into the second input of the XOR gate 763. The output of the XOR gate 763 is connected to the output K3, which carries the check bit c3.

The input E3 is furthermore connected to the first input of a further XOR gate 773, to a second input of which the circuit input E7 is connected. The output of this XOR gate is connected to the output K4, which carries the check bit c4.

The check bit c1 output at the output K1 has the value $c1=f1(x1, x2, \ldots, x8)=(x1\ x2)$ XOR $(x3\ x4)$ XOR $(x5\ x6)$ XOR $(x7\ x8)$. The check bit c2 output at the output K2 has the value $c2=f2(x1, x2, \ldots, x8)=(x1$ OR $x2)$ XOR $(\overline{x3}\ x4)$ XOR $(x5$ OR $x6)$ XOR $(\overline{x7}\ x8)$. The check bit output at the output K3 has the value $c3=f3(x1, x2, \ldots, x8)=(\overline{x1}\ x2)$ XOR $(x3$ OR $x4)$ XOR $(\overline{x5}\ x6)$ XOR $(x7$ OR $x8)$. The check bit c4 output at the output K4 has the value $c4=f4(x1, x2, \ldots, x8)=x3$ XOR $x8$.

It can easily be seen that the functions f1, f2 and f3 are nonlinear and that the function f4 is linear.

The circuit from FIG. 5 has the advantageous property that it detects all adjacent 2-bit errors, all adjacent 4-bit errors and all adjacent 6-bit errors with certainty from altered check bits. This is independent of whether or not the error that occurs is unidirectional.

Since the circuit 50 in FIG. 5 also detects all odd errors with certainty, all adjacent i-bit errors where i=1, 2, 3, 4, 5, 6, 7 are detected with certainty. By way of example, this will be shown for a 6-bit error in which, instead of the correct input values x1, x2, x3, x4, x5, x6, x7, x8, the information bits $x1\ \overline{x2}\ \overline{x3}\ \overline{x4}\ \overline{x5}\ \overline{x6}\ \overline{x7}\ x8$ are present. At the output K1, the check bit $c1=(x1\ x2)$ XOR $(x3\ x4)$ XOR $(x5\ 6)$ XOR $(x7\ x8)$ is output for the correct input values. For the erroneous input values, the check bit c1' where $c1'=(x1\ \overline{x2})$ XOR $(\overline{x3}\ \overline{x4})$ XOR $(\overline{x5}\ \overline{x6})$ XOR $(\overline{x7}\ x8)$ is obtained, from which c1 XOR c1'=x1 XOR x3 XOR x4 XOR x5 XOR x6 XOR x8 result by direct verification. At the output K3, for the correct input values the check bit $c3=(\overline{x1}\ x2)$ XOR $(x3$ OR $x4)$ XOR $(\overline{x5}\ x6)$ XOR $(x7$ OR $x8)$ is output and for the erroneous inputting the check bit c3' where $c3'=(\overline{x1}\ \overline{x2})$ XOR $(\overline{x3}$ OR $\overline{x4})$ XOR $(x5\ \overline{x6})$ XOR $(\overline{x7}$ OR $x8)$ is output, from which c3 XOR c3'=1 XOR x1 XOR x3 XOR x4 XOR x5 XOR x6 XOR x8 results by direct verification.

It is evident that for arbitrary values of the information bits x1, . . . , x8, either c1 and c1' or c3 and c3' differ and the error under consideration is therefore always detected.

Figure 6:
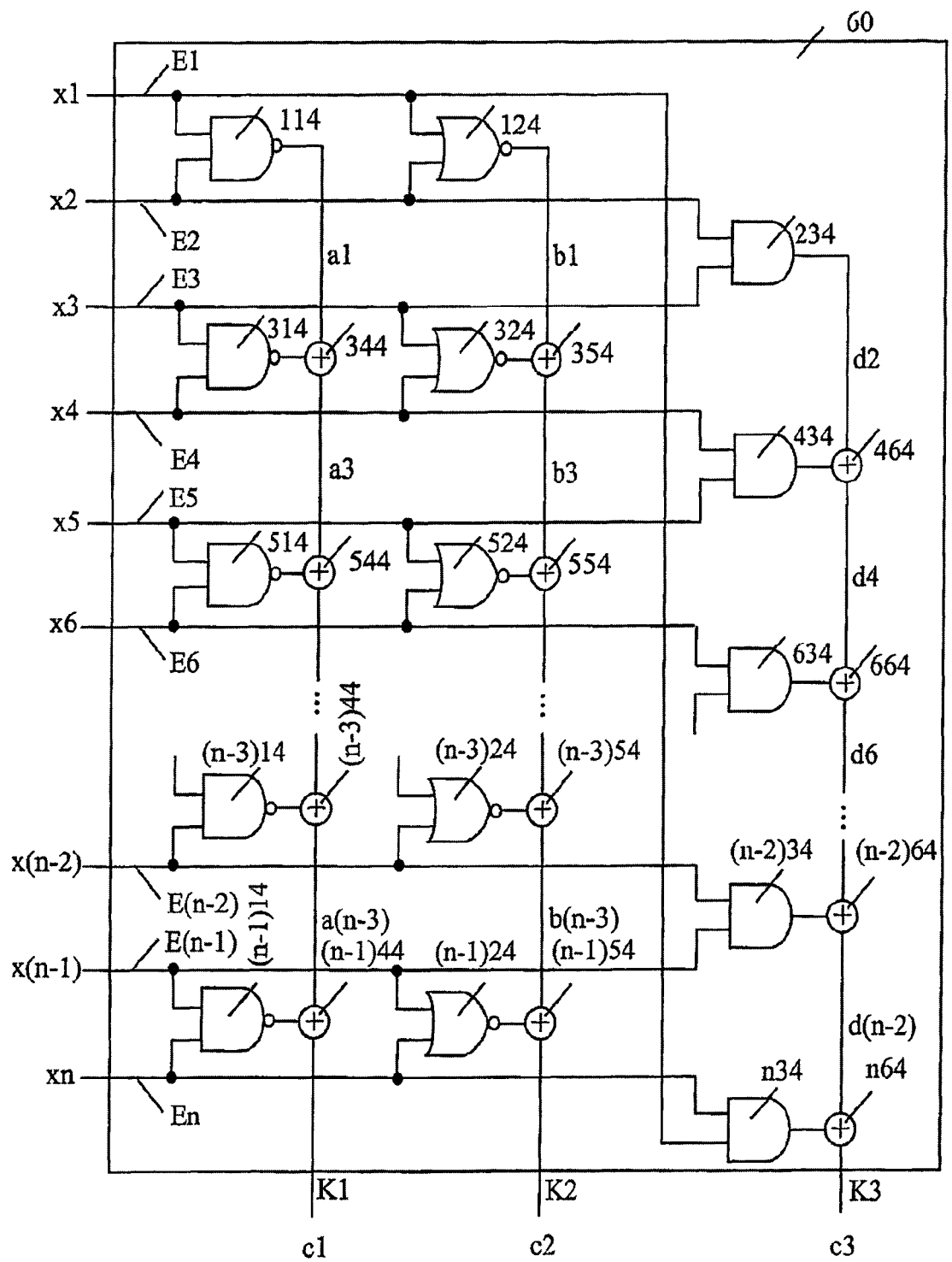
FIG. 6 shows a circuit according to an embodiment of the invention for generating m=3 check bits from n data bits.

FIG. 6 shows a further advantageous configuration of a circuit 60 according to the invention, which is described in detail below.

The circuit 60 in FIG. 6 has n inputs E1, . . . , En into which the information or data bits x1, . . . , xn are input, and three outputs K1, K2, K3 at which the check bits c1, c2, c3 are provided. n is an even number.

For i=1, 3, 4, . . . , n−1, the input Ei is simultaneously connected to the first input of a NAND gate i14 and to the first input of a NOR gate i24. The input E(i+1) is simultaneously connected to the second input of the NAND gate i14 and the second input of the NOR gate i24. The output of the NAND gate 114 is led into the first input of an XOR gate 344. For i=3, 5, . . . , n−3, the output of the NAND gate i14 is led into the second input of the XOR gate i44, the output of which is connected to the first input of a further XOR gate (i+2)44.

The output of the NAND gate (n−1)14 is led into the second input of the XOR gate (n−1)44, the output of which is the circuit output K1, which carries the check bit c1. The output of the NOR gate 124 is led into the first input of an XOR gate 354.

For i=3, 5, . . . , n−3, the output of the NOR gate i24 is led into the second input of the XOR gate i54, the output of which is connected to the first input of a further XOR gate (i+2)54.

The output of the NOR gate (n−1)24 is led into the second input of the XOR gate (n−1)54, the output of which is the circuit output K2, which carries the check bit c2.

Furthermore, for j=2, 4, 6, . . . , n−2, the input Ej is connected to the first input of an AND gate j34, the second input of which is connected to the input E(j+1).

The input En is connected to the first input of an AND gate n34, the second input of which is connected to the input E1.

The output of the AND gate 234 is connected to the first input of an XOR gate 464, into the second input of which the output of the AND gate 434 is led.

For j=4, 6, . . . , m−2, the output of the XOR gate j64 is connected to the first input of a further XOR gate (j+2)64, into the second input of which the output of the AND gate j34 is led.

The output of the XOR gate n64 is the output K3 of the circuit, which outputs the check bit c3.

The Boolean functions $c1=f1(x1, \ldots, xn)=(x1$ NAND $x2)$ XOR $(x3$ NAND $x4)$ XOR . . . XOR $(x(n-1)$ NAND $xn)$, $c2=f2(x1, \ldots, xn)=(x1$ NOR $x2)$ XOR $(x3$ NOR $x4)$ XOR . . . XOR $(x(n-1)$ NOR $xn)$, $c3=f3(x1, \ldots, xn)=(x2\ x3)$ XOR $(x4\ x5)$ XOR . . . XOR $(xn\ x1)$ are realized at the outputs K1, K2 and K3. All the functions f1, f2 and f3 are nonlinear.

Since (xi NAND xj) XOR (xi NOR xj)=xi XOR xj holds true, as is apparent most simply by verification using a truth table, c1 XOR c2=f1(x1, . . . , xn) XOR f2(x1, . . . , xn)=x1 XOR x2 XOR . . . XOR xn is obtained, and the logical XOR combination of the check bits c1 and c2 produces the parity of the information or data bits. Therefore, every odd error in the information or data bits x1, . . . , xn is detected from altered check bits c1 or c2.

Furthermore, any arbitrary error in which not all n bits are erroneous, that is to say including any error having an even number 2, 4, 6, . . . of erroneous bits, is detected from altered check bits c1, c2 and c3 with a probability of at least 1/2 if the data bits xi assume the values 0 and 1 with equal probability. Thus, the circuit 60 according to FIG. 6 detects all odd errors with certainty and all even errors at least with the probability 1/2.

As an example a 4-bit error is considered in which, instead of the correct inputtings x3, x4, x5, x6, the erroneous inputtings $\overline{x3}, \overline{x4}, \overline{x5}, \overline{x6}$ are present. All other inputtings shall be unchanged x1, x2, x7, . . . , xn. This error is then detected at the output K3 with the probability 1/2 as will now be explained.

For the error-free inputting, d2=x2 x3, d4=x2 x3 XOR x4 x5, d6=x2 x3 XOR x4 x5 XOR x6 hold true, wherein d2, d4 and d6 are the output values of the gates 234, 464 and 664 in FIG. 6. For the erroneous inputting, d2'=x2 $\bar{x}3$, d4'=x2 $\bar{x}3$ XOR $\bar{x}4$ $\bar{x}5$, d6'=x2 $\bar{x}3$ XOR $\bar{x}4$ x5 XOR $\bar{x}6$ x7 then hold true.

The error under consideration is evidently detected if d6≠d6' since all the further values that are XORed with the output of the XOR gate 664 in order to determine the check bit c3 are unchanged and, as is known, the XOR combination is unequivocally reversible. The information bit x2 can assume either the value 0 or 1. Both possibilities will be considered.

The AND gate 234, like all AND gates, is a gate having a controlling value, here having the controlling value 0. If this controlling value is input at one of its inputs, then the value 0 is output at its output, independently of what value is present at its other input.

For x2=0, the gate 234 always outputs 0, independently of what value x3 is present at its second input, since x2=0 is a controlling value of the gate.

If, for x2=0,
d6'=$\bar{x}4$ $\bar{x}5$ XOR $\bar{x}6$ x7≠x4 x5 XOR x6 x7=d6 holds true,
then the error under consideration for x2=0 is detected at the output K3.

If, for x2=0,
d6'=$\bar{x}4$ $\bar{x}5$ XOR $\bar{x}6$ x7=x4 x5 XOR x6 x7=d6 holds true,
then the error under consideration for x2=0 is not detected at the output K3.

It is assumed, then, that the error is not detected at the output K3 for x2=0.

The following then holds true for x2=1,
d6'=$\bar{x}3$ XOR $\bar{x}4$ $\bar{x}5$ XOR $\bar{x}6$ x7=$\bar{x}3$ XOR x4 x5 XOR x6 x7≠x3 XOR x4 x5 XOR x6 x7=d6,
and the error, if it is not detected for x2=0, is detected for x2=1. It should be emphasized in this case that x2 here is not among the erroneous bits.

If the information bit x2=0 and the information bit x2=1 occur with in each case the same probability 1/2, then the error under consideration, a 4-bit error, is detected with the probability 1/2. It is apparent in a completely analogous manner that an arbitrary error of the information bits is detected at one of the outputs K3 or K2 with the probability 1/2.

If the first erroneous bit is the i-th bit, then the error is detected at the output K3 if i is odd, and it is detected at the output K2 if i is even.

For the NOR gates, the controlling value is the value xj=1. If the controlling value xj=1 is input into a NOR gate, then it always outputs the value 0 at its output independently of the value present at its other input. The controlling value of a NAND gate is correspondingly the value 0. If the controlling value 0 is input into a NAND gate at one of its inputs, then the NAND gate outputs the value 1 independently of what value is present at its other input.

In FIG. 6 it is apparent that the inputs E1, . . . , En are combined in each case differently in pairs in order to form the outputs K1, K2 and K3. In order to form the outputs K1 and K2, the input pairs (E1, E2), (E3, E4), . . . , (E(n−1), En) are in each case combined by NAND and NOR gates with in each case two inputs, the outputs of which are then further XORed to form K1 and K2 respectively. In order to form the output K3, the input pairs (E2, E3), (E4, E5), . . . (En, E1) are in each case combined by NAND and NOR gates with in each case two inputs, the outputs of which are then further XORed.

The pairs of inputs which are combined in pairs by NAND, NOR and AND gates in order to determine the outputs K1, K2, on the one hand, and K3, on the other hand, each have at most one common input. Thus, the pair (E2, E3) that is combined in the AND gate 234 in order to determine the output K3 has in each case a common input with the pairs (E1, E2), and (E3, E4) that are combined in the NAND gates 114 and 314 in order to determine the output K1, the common input being namely E2 and E3, respectively. They have no common inputs with the other pairs that are NANDed in order to determine the output K1.

Figure 7:
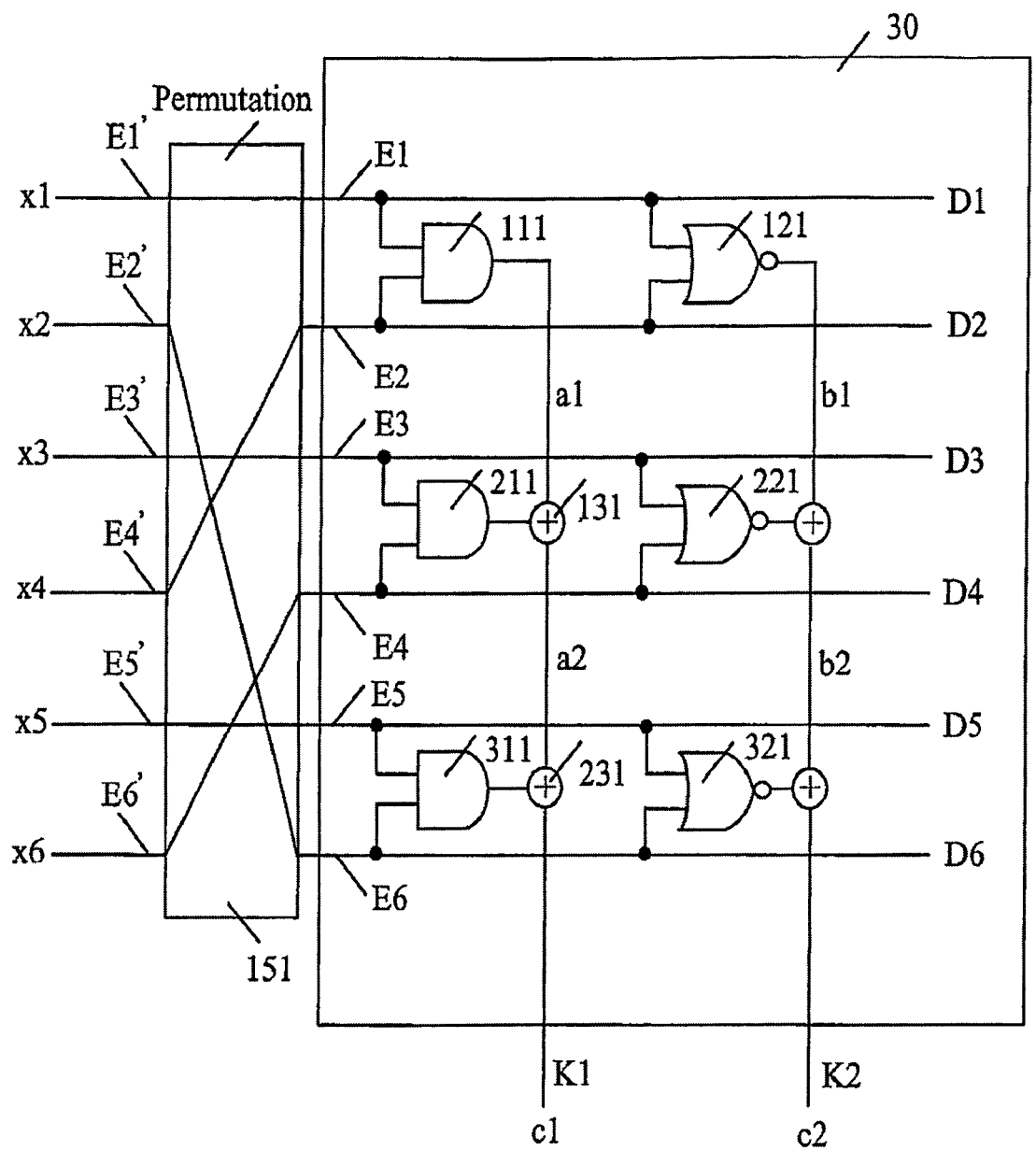
FIG. 7 shows a circuit according to an embodiment of the invention for generating m=2 check bits from six data bits, a permutation circuit for the permutation of the inputs being connected upstream of the circuit.

FIG. 7 shows a circuit arrangement for generating m=2 check bits from n=6 information bits, in which circuit inputs are permuted by a permutation circuit 151. In this case, the permutation circuit 151 can be realized simply by means of a corresponding wiring. The circuit 30 from FIG. 3 is used in FIG. 7 as an example of a circuit whose inputs are additionally permuted, and the circuit 30 need not be described again here.

The permutation circuit 151 combines it inputs E1', E2', E3', E4', E5', E6' with the inputs E1, E6, E3, E2, E5, E4 of the circuit for determining the check bits c1 and c2 according to FIG. 3. The information bits x1, x2, . . . , x6, are present at the inputs E1', E2', E3', E4', E5', E6'. On account of the permutation of the inputs, the information bits x1 and x4 are then present for example at the two inputs of the AND gate 111, while the information bits x1 and x2 would be present without permutation of the inputs. The permutation is carried out such that the two inputs of the AND gates i11 and the two inputs of the NOR gates i21, i=1, 2, 3, are not connected to adjacent inputs.

The Boolean functions f1 and f2 for determining the check bits c1 and c2 are then
c1=f1(x1, x4, x3, x6, x5, x2)=x1 x4 XOR x3 x6 XOR x5 x2,
c2=f2(x1, x4, x3, x6, x5, x2)=(x1 NOR x4) XOR (x3 NOR x6) XOR (x5 NOR x2).

The logical XOR combination of the check bits c1 and c2 again produces the negated parity 1 XOR x1 XOR x2 XOR x3 XOR x4 XOR x5 XOR x6 of the information or data bits, such that with the aid of the circuit from FIG. 7, too, all odd errors of the information bits are detected as alterations of the check bits. In comparison with the circuit from FIG. 3, it is advantageous here that as a result of the expedient permutation of the inputs with the aid of the circuit from FIG. 7, all even adjacent 2-bit errors are detected with the probability 1/2 .

As an example the 2-bit error is considered in which x1 is disturbed to become $\bar{x}1$ and x2 is disturbed to become $\bar{x}2$. In relation to the correct value, the signal a1 changes by x1 x4 XOR $\bar{x}1$ x4=x4, and the signal b1 changes by (x1 NOR x4) XOR ($\bar{x}1$ NOR x4)=1 XOR x4. The output of the AND gate 311 changes by x5 x2 XOR x5 $\bar{x}2$=x5, such that the check bit c1 changes by x4 XOR x5. The output of the NOR gate 321 changes by (x5 NOR x2) XOR (x5 NOR $\bar{x}2$)=1 XOR x5, such that the check bit c2 likewise changes by x4 XOR x5.

The error under consideration, concerning the information bits x1 and x2, is detected if x4 XOR x5=1, and it is not detected if x4 XOR x5=0. The error is detected in respectively half of all cases. Assuming that the information bits assume the values 0 and 1 equally often in each case, the error is detected with the probability 1/2. It can be shown completely analogously that all adjacent 2-bit errors are detected with the probability 1/2.

As a comparison, the case will now be considered where the error in which x1 is disturbed to become $\bar{x}1$ and x2 is disturbed to become $\bar{x}2$ is present in the circuit according to FIG. 3 without permutation on the inputs. In relation to the correct value, the signal a1 in FIG. 3 changes by x1 x2 XOR $\bar{x}1$ $\bar{x}2$=1 XOR x1 XOR x2, and the signal b1 changes by (x1 NOR x2) XOR ($\bar{x}1$ NOR $\bar{x}2$)=1 XOR x1 XOR x2.

Both the check bit c1 and the check bit c2 change by 1 XOR x1 XOR x2, and the error is detected if x1 XOR x2=0 or $x1=x2$ holds true. However, if $x1=0$, $x2=1$ or $x1=1$, $x2=0$ holds true, then this 2-bit error with adjacent bits is never detected.

It is evident that conditions occur here which comprise the correct values of the variables whose errors are considered. If a permutation is disposed upstream, then conditions are to be met which concern variables which are not erroneous.

If it can be assumed that an error is present for a plurality of clock cycles, then an adjacent 2-bit error is detected by a circuit with upstream permutation with high probability, while it possibly cannot be detected at all without upstream permutation.

The error under consideration, concerning the information bits $x1$ and $x2$, is detected if $x4$ XOR $x5=1$, and it is not detected if $x4$ XOR $x5=0$. The error is detected in respectively half of all cases. Assuming that the information bits assume the values 0 and 1 equally often in each case, the error is detected with the probability 1/2. It can be shown completely analogously that all adjacent 2-bit errors are detected with the probability 1/2.

Figure 8:
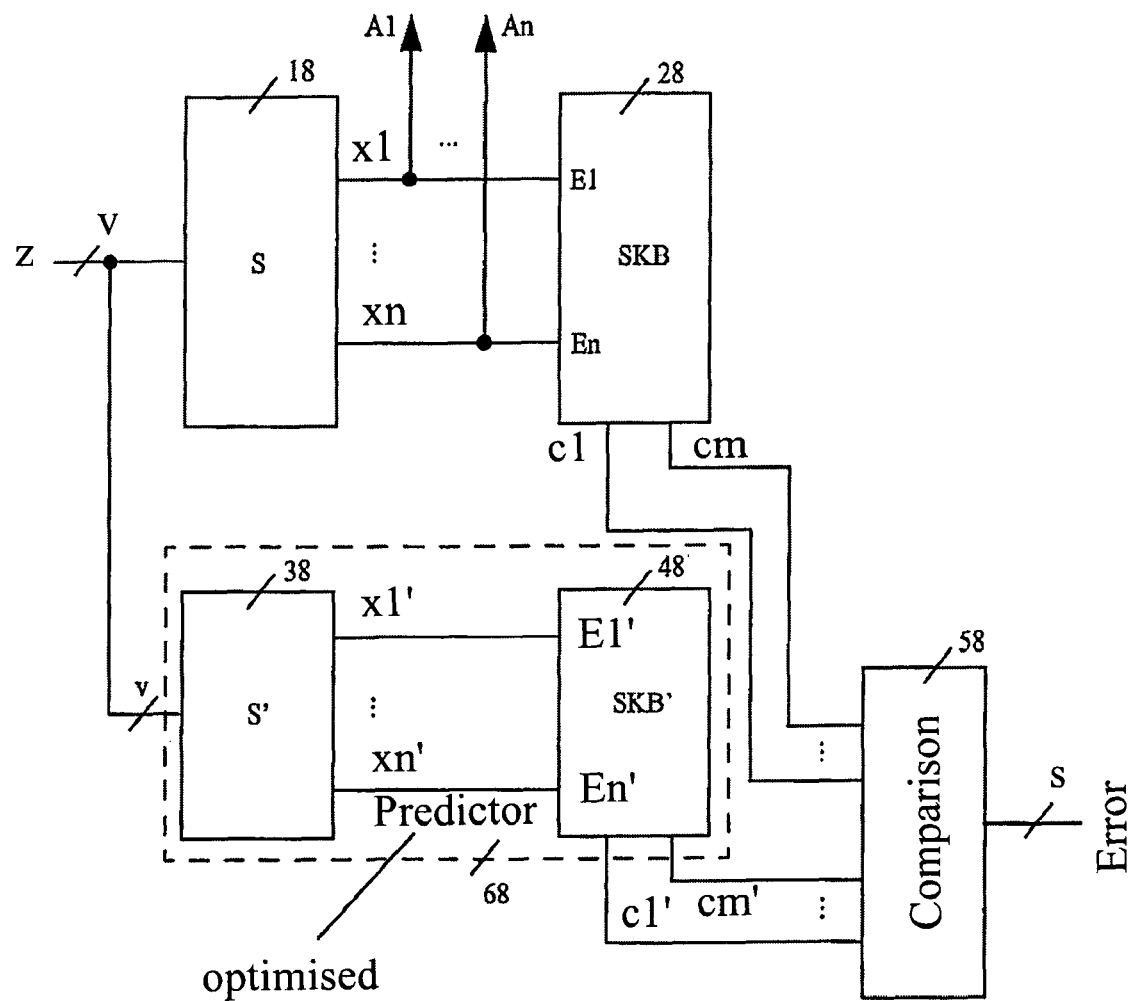
FIG. 8 shows a schematic illustration of an arrangement comprising circuit elements for monitoring a digital circuit in the course of operation using a circuit for generating m check bits.

FIG. 8 shows a schematic illustration of an arrangement comprising circuit elements for monitoring a digital circuit S 18 in the course of operation.

An r-dimensional input vector z is input into the circuit 18, and is processed in the circuit 18 according to the task into an n-dimensional output vector $X=x1, \ldots, xn$. The following holds true: r greater than or equal to 1, $n=2k$ and k greater than or equal to 1.

For $i=1, \ldots, m$, the output of the circuit 18, which output carries the binary value $xi$, is connected to the functional output $Ai$ and simultaneously to the input $Ei$ of a circuit 28 for generating m check bits $c1, \ldots, cm$ from n information bits $x1, \ldots, xn$. The following holds true: m greater than or equal to 1. At the same time, the m-dimensional input vector z is input into a digital circuit S' 38, which is a functionally identical copy of the circuit S 18 and which processes the input vector z into the output vector $x1', \ldots, xn'$.

For $i=1, \ldots, n$, the output of the circuit S' 38, which output carries the binary value $xi'$, is connected to the input $Ei$ of a circuit SKB' 48, wherein the circuit SKB' 48 is functionally identical to the circuit SKB 28. The circuit SKB' 48 provides the m check bits $c1', \ldots, cm'$.

The check bits $c1, \ldots, cm$ and $c1', \ldots, cm'$ are compared by a comparator 58.

If no error occurs in any of the circuits S 18, S' 38, SKB 28 and SKB' 48, then $xi=xi'$ holds true for $i=1, \ldots, n$ and $cj=cj'$ holds true for $j=1, \ldots, m$, and the comparator 58 does not indicate an error at its s-bit wide output, where s is less than or equal to 2. If an error occurs in the circuit S 18 to be monitored, then this circuit outputs an erroneous output vector $xf1, \ldots, xfn$ instead of the correct output vector $x1, \ldots, xn$. In the case where the erroneous output vector is input into a circuit SKB 28, this circuit outputs the check bits $cf1, \ldots, cfm$.

If $cf1, \ldots, cfm$ is not equal to $c1, \ldots, cm$, then the error of the circuit S 18 is detected upon comparison in the comparator 58.

Since, in contrast to the output vector of the monitored circuit S 18, the output vector $x1', \ldots, xn'$ of the duplicated circuit S' 28 is not required, the circuits S' 28 and SKB' 48 can be realized and optimized jointly as a (predictor) circuit Pr 68. For this purpose, the person skilled in the art can, for example, simply allow the series circuit of the circuit S' 28 and SKB' 48 to be optimized by a synthesis tool.

It is evident that for $m=1$ the comparator 58 for $s=2$ consists simply in conducting through the two signal lines carrying the check signals $c1$ and $c1'$. For $s=1$, these two signal lines are to be logically combined by an XOR element or by an XNOR element.

The features of the invention which are disclosed in the description above, the claims and the drawing may be of importance both individually and in any desired combination for the realization of the invention in its various embodiments.

The invention claimed is:

1. A circuit arrangement for generating at least one check bit that can be evaluated for error detection, the circuit arrangement comprising:
   a combinational circuit having n binary inputs $E1, \ldots, En$ for inputting n ($n \geq 2$) information bits $x1, \ldots, xn$ and m binary outputs for outputting m ($m \geq 1$) check bits $c1, \ldots, cm$;
   wherein the combinational circuit is configured to realize a Boolean function $ci=fi(xi1, \ldots, xini)$ for $i=1, \ldots, m$ at the i-th output for determining a check bit $ci$, wherein the set $\{xi1, \ldots, xini\}$ at the ni information bits that determine the check bit $ci$ is a subset of all n information bits $\{x1, \ldots, xn\}$; and
   wherein the combinational circuit is furthermore configured to realize a first Boolean function $f1(x11, \ldots, x1n1)$ of the form $c1=f1(x11, \ldots, x1n1)=f11(x11, x12)$ XOR $f12(x13, x14)$ XOR $\ldots$ XOR $f1k1(x1(n1-1), x1n1)$ at a first output for outputting a first check bit $c1$, wherein $n1$ is an even number where $n1 \geq 2$ and $2k1=n1$ and the Boolean functions $f11(x11, x12), \ldots, f1k1(x1(n-1), x1n1)$ are each nonlinear Boolean functions of two variables that can be realized by logic gates having two inputs and one output, wherein the logic gates each have a controlling value $c11, \ldots, c1k1$.

2. The circuit arrangement as claimed in claim 1, wherein $m \geq 2$;
   wherein the combinational circuit realizes a Boolean function $f2(x21, \ldots, x2nn)$ of the form $c2=f2(x21, \ldots, x2n)=f21(x21, x22)$ XOR $f22(x23, x24)$ XOR $\ldots$ XOR $f2k2(x2(n2-1), x2n2)$ at a second output for outputting a second check bit $c2$; wherein for $2k2=n2$ ($n2$ is an even number; $n2 \geq 2$); and
   wherein the Boolean functions $f21(x21, x22), \ldots, f2k2(x2(n2-1), x2n)$ are each nonlinear Boolean functions of two variables that can be realized by logic gates having two inputs and one output that have a controlling value $c21, \ldots, c2k$.

3. The circuit arrangement as claimed in claim 2, wherein $n1=n2$ and $k1=k2$.

4. The circuit arrangement as claimed in claim 3, wherein $x1r=x2r$ for $r=1, \ldots, n1$ and wherein $f1s$ is not equal to $f2s$ for $s=1, \ldots, k1$.

5. The circuit arrangement as claimed in claim 2, wherein $n1=n2=n$.

6. The circuit arrangement as claimed in claim 3, wherein $x11=x2n1$ and $x2s=x1(s+1)$ for $s=1, \ldots, n1-1$.

7. The circuit arrangement as claimed in claim 2, wherein $n2=n1-2$.

8. The circuit arrangement as claimed in claim 7, wherein $x2r=x1(r+1)$ for $r=1, \ldots, n2$.

9. The circuit arrangement as claimed in claim 1, wherein an XOR sum of a subset of the functions $f1(x11, \ldots, x1n1)$, $f2(x21, \ldots, x2n2), \ldots, fm(xm1, \ldots, xmmm)$, which contains at least two nonlinear functions $f1(x11, \ldots, x1n1)$ and $f2(x21, \ldots, x2n2)$ is equal to a parity $x1$ XOR $x2$ XOR $\ldots$ XOR $xn$ of the n information bits.

10. The circuit arrangement as claimed in claim 1, wherein an XOR sum of a subset of the functions $f1(x11, \ldots, x1n1)$, $f2(x21, \ldots, x2n2), \ldots, fm(xm1, \ldots, xmmm)$, which contains at least two nonlinear functions $f1(x11, \ldots, x1n1)$ and $f2(x21, \ldots, x2n2)$, is equal to a negated parity $x1$ XOR $x2$ XOR $\ldots$ XOR $xn$ XOR$1$ of the n information bits.

11. The circuit arrangement as claimed in claim 1, wherein at least three outputs K1, K2 and K3 provide at least three check bits $c1, c2, c3$ assigned to the at least three outputs K1, K2 and K3, wherein a nonlinear function $f3(x11, \ldots, x1n1)$ realized at the output K3 depends on the same information bits $x11, \ldots, x1n1$ as the Boolean function $f1(x11, \ldots, x1n1)$ and has the form $f3(x11, x12, \ldots, x1n1)=f31(x12, x13)$ XOR $f32(x14, x15)$ XOR $\ldots$ XOR $f3k1(x1n1, x11)$, and wherein the functions $f31, \ldots, f3k1$ are each two-digit nonlinear Boolean functions that can be realized by logic gates having two inputs and one output which each have a controlling value $c31, \ldots, c3k1$.

12. The circuit arrangement as claimed in claim 1, wherein at least three outputs K1, K2 and K3 provide at least three check bits $c1, c2, c3$ assigned to the at least three outputs K1, K2 and K3, wherein the nonlinear function $f3$ realized at the output K3 is an XOR sum of a subset of a nonlinear Boolean functions $f31(x12, x13), f32(x14, x15), \ldots, f3k1(x1n1, x11)$ and the functions $f31, \ldots, f3k1$ are in each case two-digit nonlinear Boolean functions which can be realized by logic gates having two inputs and one output which each have a controlling value $c31, \ldots, c3k1$.

13. The circuit arrangement as claimed in claim 1, further comprising a permutation circuit connected upstream of the combinational circuit, the permutation circuit providing a permutation of the n binary inputs E1, $\ldots$, En.

14. A circuit arrangement comprising:
a circuit for generating at least one check bit;
at least one further circuit; and
a comparator;
wherein the circuit arrangement monitors a digital circuit, the digital circuit having r inputs and n functional outputs A1, $\ldots$, An;
m check bits $c1, \ldots, cm$ that can be evaluated for error detection can be generated from n information bits $x1, \ldots, xn$ by the circuit arrangement;
the digital circuit is connected upstream of the circuit arrangement;
the r inputs of the digital circuit carry binary input signals $z=z1, \ldots, zr$ and n outputs of the digital circuit carry binary output signals $x=x1, \ldots, xn$, such that the outputs of the digital circuit are simultaneously connected to n functional outputs A1, $\ldots$, An and inputs E1, $\ldots$, En of the circuit arrangement;
the r inputs of the digital circuit are furthermore connected to another circuit, wherein the other circuit is functionally identical to the digital circuit and the outputs of the other circuit, with inputting of the values $z=z1, \ldots, zn$, carry the binary values $x1', \ldots, xn'$;
the outputs of the other circuit are connected to n inputs of a further circuit, wherein the further circuit is functionally identical to the circuit arrangement and the outputs of the further circuit, with inputting of the binary values $x1', \ldots, xn'$, carry the values $c1', \ldots, cm'$; and
the comparator comprises the output signals $c1, \ldots, cm$ of the circuit arrangement and the output signals $c1', \ldots, cm'$ of the further circuit.

15. The circuit arrangement as claimed in claim 14, wherein the other circuit, and the further circuit, are connected in series and are realized and optimized jointly as one circuit.

16. The circuit arrangement as claimed in claim 14, wherein m=1 and wherein the comparator is formed from two lines for the check signals $c1$ and $c1'$.

17. A method for generating at least one check bit that can be evaluated for error detection for a circuit arrangement, in which at least one check bit $c1, \ldots, cm$ ($m \geq 1$) is generated from $n(n \geq 2)$ information bits $x1, \ldots, xn$, the method comprising:
providing the n information bits $x1, \ldots, xn$; and
generating the at least one check bit $ci$ for $i=1, \ldots, m$ in accordance with a Boolean function $ci=fi(xi1, \ldots, xini)$, wherein the set $\{xi1, \ldots, xini\}$ of the ni information bits is a subset of all n information bits $\{x1, \ldots, xn\}$, wherein:
the at least one first check bit $c1$ is generated in accordance with a first Boolean function $f1(x11, \ldots, x1n1)$ of the form $c1=f1(x11, \ldots, x1n1)=f11(x11, x12)$ XOR $f12(x13, x14)$ XOR $\ldots$ XOR $f1k1(x1(n1-1), x1n1)$, and
$n1$ is an even number where $n1 \geq 2$ and $2 \; k1=n1$ and Boolean functions $f11(x11, x12), \ldots, f1k1(x1(n1-1), x1n1)$ are in each case nonlinear Boolean functions of two variables which each have a controlling value $c11, \ldots, c1k1$.

18. The method as claimed in claim 17, wherein for $m \geq 2$;
a second check bit $c2$ is generated by means of a Boolean function $f2(x21, \ldots, x2nn)$ of the form $c2=f2(x21, \ldots, x2n)=f21(x21, x22)$ XOR $f22(x23, x24)$ XOR $\ldots$ XOR $f2k2(x2(n2-1), x2n2)$ wherein for $2 \; k2=n2(n2$ is an even number; $n2 \geq 2)$;
wherein the Boolean functions $f21(x21, x22), \ldots, f2k2(x2(n2-1), x2n)$ are in each case nonlinear Boolean functions of two variables which have a controlling value $c21, \ldots, c2k$.

19. The method as claimed in claim 18, wherein at least three check bits $c1, c2, c3$ are generated, wherein a nonlinear function $f3(x11, \ldots, x1n1)$ realized for generating a check bit $c3$ depends on the same information bits $x11, \ldots, x1n1$ as the Boolean function $f1(x11, \ldots, x1n1)$ and has the form $f3(x11, x12, \ldots, x1n1)=f31(x12, x13)$ XOR $f32(x14, x15)$ XOR $\ldots$ XOR $f3k1(x1n1, x11)$, wherein the functions $f31, \ldots, f3k1$ are each two-digit nonlinear Boolean functions and each have a controlling value $c31, \ldots, c3k1$.

* * * * *